(12) United States Patent
Shim et al.

(10) Patent No.: US 7,928,540 B2
(45) Date of Patent: Apr. 19, 2011

(54) INTEGRATED CIRCUIT PACKAGE SYSTEM

(75) Inventors: Il Kwon Shim, Singapore (SG); Antonio B. Dimaano, Jr., Singapore (SG); Henry D. Bathan, Singapore (SG); Jeffrey D. Punzalan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 789 days.

(21) Appl. No.: 11/558,589

(22) Filed: Nov. 10, 2006

(65) Prior Publication Data
US 2008/0111215 A1    May 15, 2008

(51) Int. Cl.
*H01L 21/56* (2006.01)
*H01L 23/495* (2006.01)

(52) U.S. Cl. .. 257/666; 257/669; 257/674; 257/E23.031; 257/E23.043; 257/E23.045; 257/E23.046; 438/123; 361/813

(58) Field of Classification Search .......... 257/666, 257/E23.043, 669, E23.031, 674, E23.045, 257/E23.046; 361/813; 438/123
See application file for complete search history.

(56) References Cited

U.S. PATENT DOCUMENTS

| | | | |
|---|---|---|---|
| 6,451,629 B2 | 9/2002 | James | |
| 6,638,790 B2 | 10/2003 | Minamio et al. | |
| 6,815,261 B2 | 11/2004 | Mess | |
| 6,965,157 B1 * | 11/2005 | Perez et al. | 257/666 |
| 7,060,536 B2 | 6/2006 | Punzalan et al. | |
| 7,087,461 B2 | 8/2006 | Park et al. | |
| 2002/0008312 A1 * | 1/2002 | Sasaki et al. | 257/692 |
| 2002/0031869 A1 * | 3/2002 | Minamio et al. | 438/127 |
| 2002/0041010 A1 * | 4/2002 | Shibata | 257/666 |
| 2003/0178723 A1 * | 9/2003 | Ito et al. | 257/735 |
| 2006/0249830 A1 * | 11/2006 | Shim et al. | 257/690 |

* cited by examiner

*Primary Examiner* — Eugene Lee
*Assistant Examiner* — Peniel M Gumedzoe
(74) *Attorney, Agent, or Firm* — Mikio Ishimaru

(57) ABSTRACT

An integrated circuit package system is provided including forming an external interconnect having a lead body and a lead tip, forming a lead protrusion in the lead tip, connecting a device and the external interconnect, and encapsulating the device and the external interconnect.

20 Claims, 3 Drawing Sheets

INTEGRATED CIRCUIT PACKAGE SYSTEM

TECHNICAL FIELD

The present invention relates generally to integrated circuit packages and more particularly to molded integrated circuit packages.

BACKGROUND ART

Modern electronics, such as smart phones, personal digital assistants, location based services devices, enterprise class servers, or enterprise class storage arrays, are packing more integrated circuits into an ever-shrinking physical space with expectations for decreasing cost. Contemporary electronics expose integrated circuits and packages to more demanding and sometimes new environmental conditions, such as cold, heat, and humidity requiring integrated circuit packages to provide robust structures.

Numerous technologies have been developed to meet these requirements. Some of the research and development strategies focus on new technologies while others focus on improving the existing and mature technologies. Research and development in the existing technologies may take a myriad of different directions.

One proven way to reduce cost is to use mature package technologies with existing manufacturing methods and equipments. Existing packaging technologies struggle to cost effectively meet the ever-demanding thermal, reliability, and structural requirements of today's integrated circuits and packages.

Integrated circuit dies are conventionally enclosed in plastic packages that provide protection from hostile environments and enable electrical interconnection between the integrated circuit die and an underlying substrate. A lead frame is the central supporting structure of such a package. A portion of the lead frame is internal to the package, i.e., completely surrounded by the plastic encapsulant.

For purposes of high-volume, low-cost production of integrated circuit packages, a current industry practice is to etch or stamp a thin sheet of metal material to form a panel or strip that defines multiple lead frames. A single strip may be formed to include multiple arrays, with each such array including a multiplicity of lead frames in a particular pattern. In a typical integrated circuit package manufacturing process, the integrated circuit dies are mounted and wire bonded to respective ones of the lead frames, with the encapsulant material then being applied to the strips to encapsulate the integrated circuit dies, bond wires, and portions of each of the lead frames in the above-described manner. One approach to apply the encapsulant is called block molding processes.

During block molding processes, the leadless devices can be deflected due to the interaction of shear stresses and bending moments that result from clamping the mold as well as thermally induced stresses. Accordingly, mold flash may occur during the molding process reducing integrated circuit package reliability and yield due to structural damage or missing pins covered by the mold flash.

QFN package offers a good solution to leaded package wherein trim and form process was eliminated, no downset for lead frame in which cost was also improved. Higher I/O is being sought by the industry for leaded application and QFN dual row approach is gaining a lot of attention due to increased I/O with small form factor.

For QFN saw application, pre-taped lead frame is used to prevent/eliminate mold flash. Punch type QFN, on the other hand, does not need such approach due to individual clamping. However, QFN with dual rows has mold flash problems due to fine pitch and thinner lead frame configuration. For example, the inner row leads of the dual row QFN lead frames may have half-etched areas providing vertical spacing difference for the outer row leads. The clamping force by the mold chase may lift the inner leads resulting in mold flash for the arced inner leads. Incoming condition also becomes a factor and process flow becomes complicated to improve. For example, the lead frames entering the molding process may have some deformities, such as bent pins, that are predisposed to mold flash.

Thus, a need still remains for an integrated circuit package system providing low cost manufacturing and improved yield for the integrated circuit package. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming an external interconnect having a lead body and a lead tip, forming a lead protrusion in the lead tip, connecting a device and the external interconnect, and encapsulating the device and the external interconnect.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
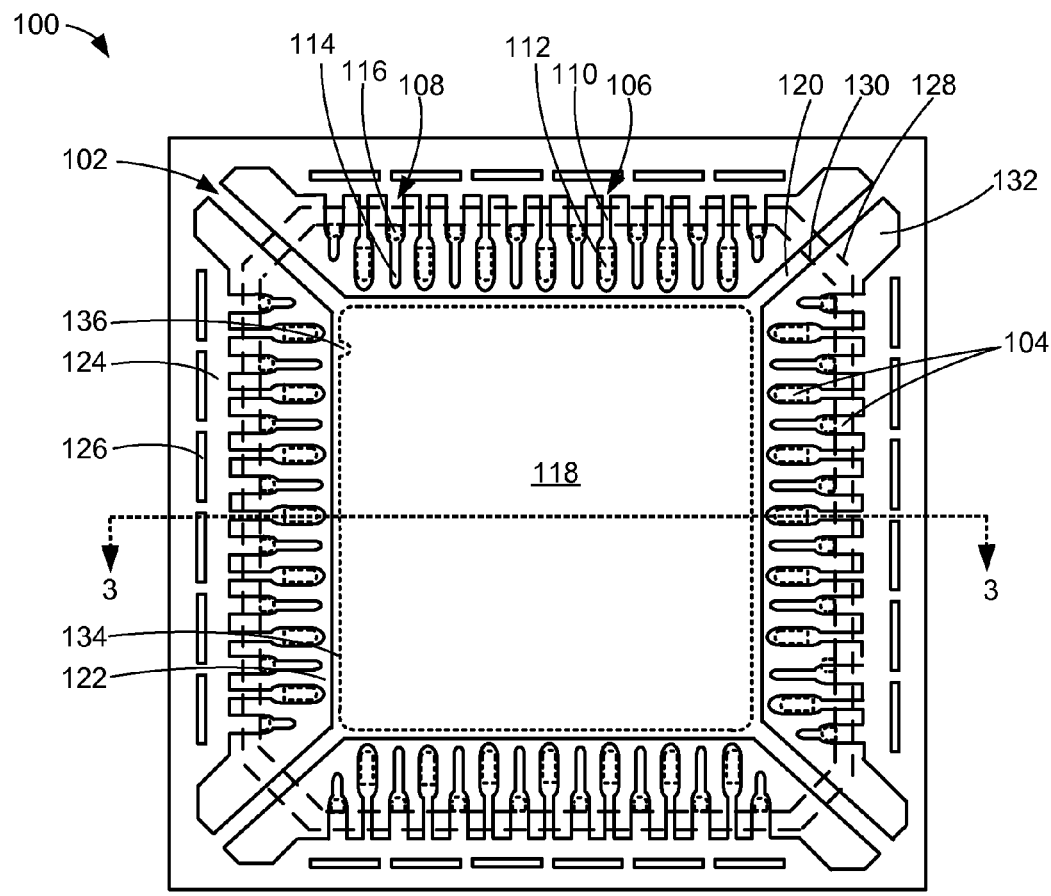
FIG. 1 is a plan view of an integrated circuit package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure. The term "system" as used herein means and refers to the method and to the apparatus of the present invention in accordance with the context in which the term is used.

Referring now to FIG. 1, therein is shown a plan view of an integrated circuit package system 100 in an embodiment of the present invention. The plan view depicts the integrated circuit package system 100 as unsingulated from a lead frame 102. The lead frame 102 has dual rows of external interconnects 104. An inner row of the external interconnects 104 has inner leads 106. An outer row of the external interconnects 104 has outer leads 108.

Each of the inner leads 106 has an inner lead tip 110 that may be formed by a number of processes, such as half etching, to provide the inner lead tip 110 thinner than other portions of the inner leads 106. The formation of the inner lead tip 110 also forms an inner lead body 112 thicker than the inner lead tip 110. The inner lead body 112 extends towards an interior of the integrated circuit package system 100 and the inner lead tip 110 extends towards a periphery of the integrated circuit package system 100. The inner lead body 112 is wider than the inner lead tip 110.

Each of the outer leads 108 has an outer lead tip 114 that may be formed by a number of processes, such as half etching. The formation of the outer lead tip 114 also forms an outer lead body 116. The outer lead body 116 is towards a periphery of the integrated circuit package system 100 and the outer lead tip 114 is towards an interior of the integrated circuit package system 100. The outer lead body 116 is wider than the outer lead tip 114.

The inner leads 106 and the outer leads 108 are at alternating locations to one another. The dimensions of the inner leads 106 and the outer leads 108 are complementary. The complementary dimensions provide a higher density of the external interconnects 104. The inner lead tip 110 and the outer lead body 116 are adjacent to each other towards the periphery of the integrated circuit package system 100 without the inner leads 106 contacting the outer leads 108. The inner lead body 112 and the outer lead tip 114 are adjacent to each other towards the periphery of the integrated circuit package system 100 without the inner leads 106 contacting the outer leads 108.

The integrated circuit package system 100 also includes a paddle 118, such as a die-attach paddle. Tie bars 120 attach to corners of the paddle 118. Inner voids 122 are the space between the external interconnects 104, the paddle 118, and the tie bars 120. Dam bars 124 are between the inner voids 122 and outer voids 126. The dam bars 124 help prevent molding material from flowing over the external interconnects 104 upon encapsulating.

A singulation outline 128 depicted by the dotted line shows the singulation boundary of the lead frame 102. The dam bars 124, portions of the external interconnects 104, and portions of the tie bars 120 are removed upon singulation forming the integrated circuit package system 100. A mold outline 130 depicted by the dotted line within the singulation outline 128 shows the outline of an encapsulation 132, such as an epoxy mold compound, of the integrated circuit package system 100.

A paddle outline 134 depicted by a dotted line within the paddle 118 shows a bottom peripheral region of the paddle 118 that is half etched. A recess 136 in the paddle outline 134 may represent the pin 1 location of the integrated circuit package system 100.

Figure 2:
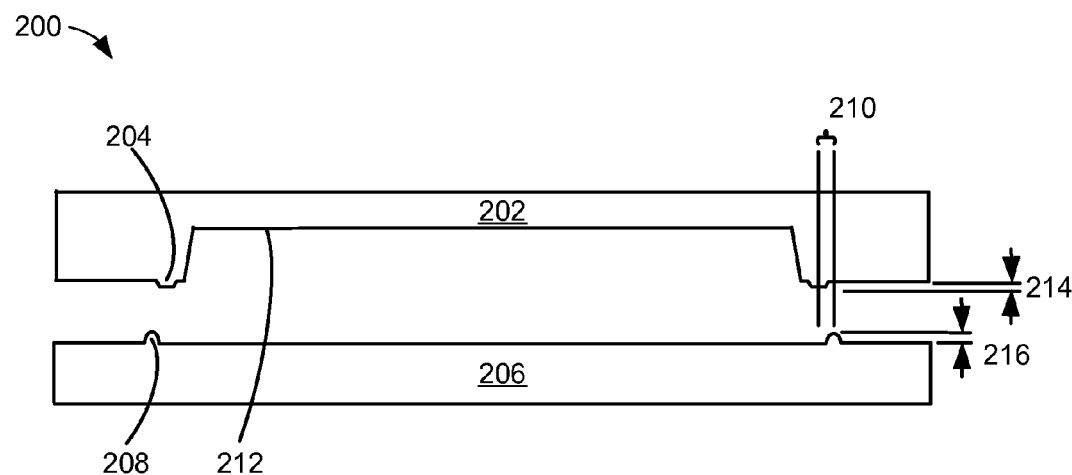
FIG. 2 is a cross-sectional view of a mold design in an embodiment of the present invention.

Referring now to FIG. 2, therein is shown a cross-sectional view of a mold design 200 in an embodiment of the present invention. The mold design 200 is part of an encapsulating system (not shown) that forms the encapsulation 132 of FIG. 1. The mold design 200 or also referred to as the mold includes a top chase 202 having a first protrusion 204 and a bottom chase 206 having a second protrusion 208.

The first protrusion 204 and the second protrusion 208 have an offset 210 such that the first protrusion 204 and the second protrusion 208 do not contact each other with the top chase 202 clamped with the bottom chase 206, to be described more below. The value of the offset 210 has a range about a thickness of the inner lead tip 110 of FIG. 1 to twice the thickness of the inner lead tip 110, such as a range about 0.037 mm to 0.087 mm. The second protrusion 208 is located more towards the periphery of the mold design 200 than the first protrusion 204. The first protrusion 204 is more towards a cavity 212, such as a mold cap, of the top chase 202.

The first protrusion 204 and the second protrusion 208 have a first height 214 and a second height 216, respectively. The value of the first height 214 has a range about one tenth of the thickness of the inner lead tip 110 to a thickness of the inner lead body 112 of FIG. 1, such as a range about 0.050 mm to 0.10 mm. The value of the second height 216 has a range about one tenth of the thickness of the inner lead tip 110 to the thickness of the inner lead body 112.

For illustrative purposes, the cross-sectional view of the mold design 200 shows the first protrusion 204 and the second protrusion 208 on both sides of the cavity 212, although it is understood that the first protrusion 204 and the second protrusion 208 may be only at one side of the cavity 212. Also for illustrative purposes, this cross-sectional view shows the first protrusion 204 and the second protrusion 208, although it is understood that the mold design 200 may not show the first protrusion 204 and the second protrusion 208 in a different cross-sectional view. Further for illustrative purposes, the mold design 200 is shown with the top chase 202 having the first protrusion 204 and the bottom chase 206 having the second protrusion 208. It is understood that the mold design 200 may have a recess (not shown) in the top chase 202 complementary to the second protrusion 208 or a recess (not shown) in the bottom chase 206 complementary to the first protrusion 204.

Figure 3:
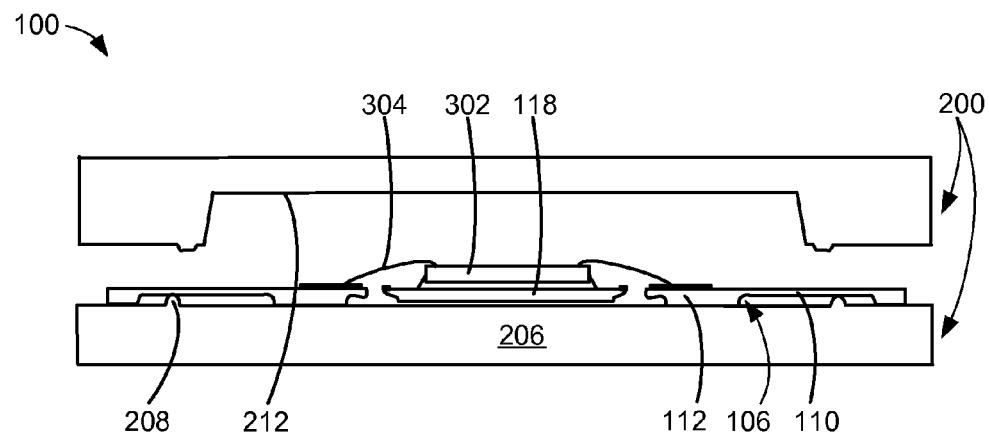
FIG. 3 is a cross-sectional view of the integrated circuit package system along a line segment 3-3' in a mold mount phase.

Referring now to FIG. 3, therein is shown a cross-sectional view of the integrated circuit package system 100 along a line segment 3-3' in a mold mount phase. The integrated circuit package system 100 is placed in the mold design 200 and on the bottom chase 206. The inner leads 106 are over the bottom chase 206 with the inner lead tip 110 on the second protrusion 208 and the inner lead body 112 below the cavity 212.

A device 302, such as an integrated circuit die, is over the paddle 118. Internal interconnects 304, such as bond wires, connect the device 302 and the inner lead body 112. The paddle 118, the device 302, and the internal interconnects 304 are below the cavity 212. The internal interconnects 304 also connect the device 302 and the outer leads 108 of FIG. 1. The outer leads 108 are also over the bottom chase 206 in this phase.

For illustrative purposes, the device 302 is shown as an integrated circuit die, although it is understood that the device 302 may be a different device type, such as a packaged integrated circuit or a stack of integrated circuits. Also for illustrative purposes, the internal interconnects 304 are shown as bond wires, although it is understood that the internal interconnects 304 may be different, such as sold balls for a flip chip.

Figure 4:
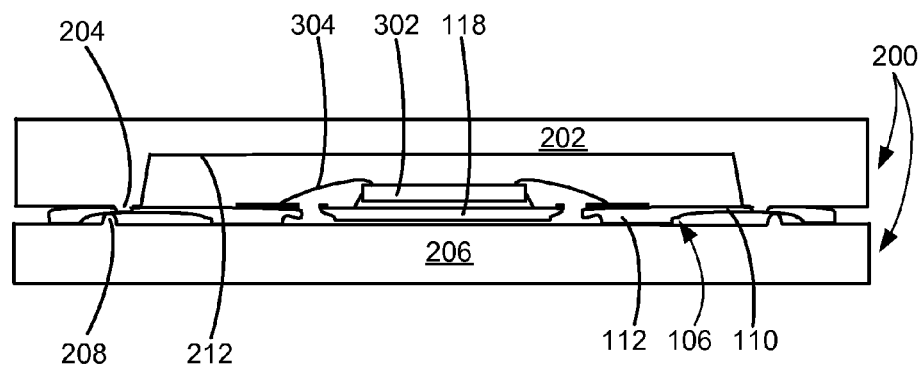
FIG. 4 is the structure of FIG. 3 in a mold-clamping phase.

Referring now to FIG. 4, therein is shown the structure of FIG. 3 in a mold-clamping phase. This phase depicts the mold design 200 clamping with the top chase 202 and the bottom chase 206 contacting the inner leads 106. This clamping action deforms the inner lead tip 110 as the first protrusion 204 and the second protrusion 208 presses on the inner lead tip 110. The device 302, the inner lead body 112, the paddle 118, and the internal interconnects 304 are over the bottom chase 206 and within the cavity 212.

As described in FIG. 2, the top chase 202 may have a different structure than the first protrusion 204 and the bottom chase 206 may have a different structure than the second protrusion 208 that complements the top chase 202. The top chase 202 and the bottom chase 206 may have a number of different design variations preventing or eliminating mold bleeds on the inner leads 106 and the outer leads 108 of FIG. 1.

Figure 5:
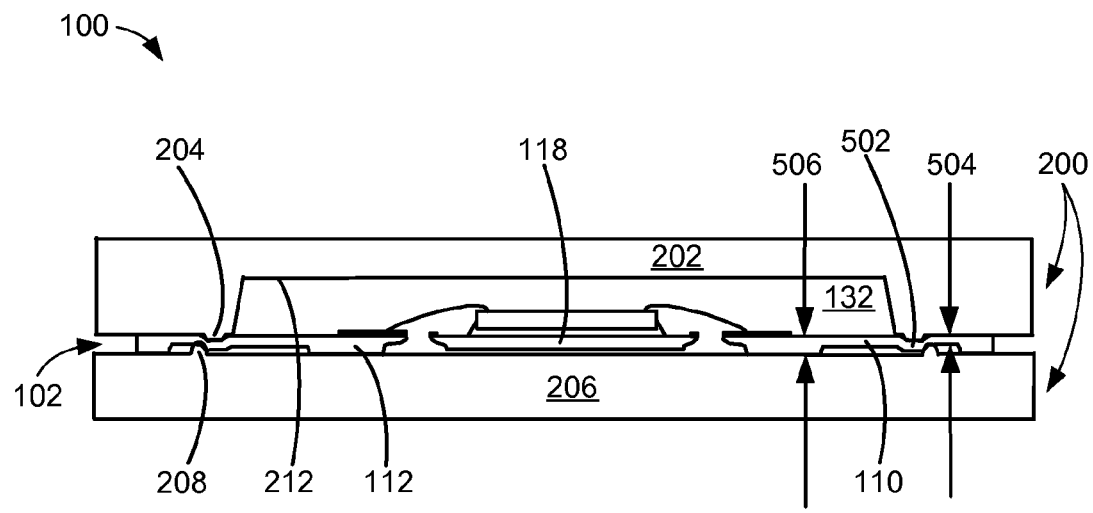
FIG. 5 is the structure of FIG. 4 in a molding phase.

Referring now to FIG. 5, therein is shown the structure of FIG. 4 in a molding phase. The top chase 202 is clamped over the bottom chase 206 forming a lead protrusion 502 in the inner lead tip 110. The force forming the lead protrusion 502 provides a force placing the inner lead body 112 on the bottom chase 206 preventing mold flash below the inner lead body 112.

The lead protrusion 502 is formed with the second protrusion 208 and does not contact other portions of the bottom chase 206. The lead protrusion 502 is formed in the thinned inner lead tip 110 and having a top recess with a bottom extent opposite the top recess below the thinned inner lead tip 110 and above a bottom extent of the inner lead body 112. A lead protrusion height 504 does not impede the inner lead body 112 and the outer lead body 116 of FIG. 1 from further connection to the next system level (not shown), such as a printed circuit board or another integrated circuit package. The lead protrusion height 504 is less then an inner body thickness 506 of the inner lead body 112.

For illustrative purposes, the lead protrusion 502 is described as formed by clamping of the top chase 202 and the bottom chase 206, although it is understood that the lead protrusion 502 may be preformed in the lead frame 102. Also for illustrative purposes, the mold design 200 has the first protrusion 204 and the second protrusion 208, although it is understood that the mold design 200 may be different to clamp the lead frame 102 having preformed structures to prevent mold bleeds. Further for illustrative purposes, the lead protrusion 502 is shown as not encapsulated, although it is understood that the lead protrusion 502 may be in the encapsulation 132.

A molding compound fills the cavity 212 forming the encapsulation 132 and covering the device 302 of FIG. 3, the internal interconnects 304 of FIG. 3, the external interconnects 104 of FIG. 1, and the paddle 118. The integrated circuit package system 100 is singulated from the lead frame 102. As described earlier, the dimensions of the lead protrusion 502 does not impede further connections of the external interconnects 104 and the next system level (not shown).

Figure 6:
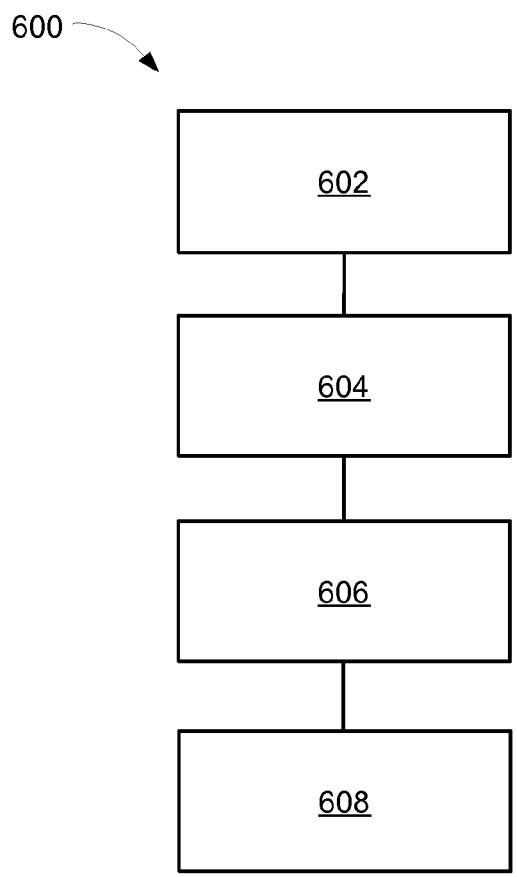
FIG. 6 is a flow chart of an integrated circuit package system for the manufacture of the integrated circuit package system in an embodiment of the present invention.

Referring now to FIG. 6, therein is shown a flow chart of an integrated circuit package system 600 for manufacture of the integrated circuit package system 100 in an embodiment of the present invention. The system 600 includes forming an external interconnect having a lead body and a lead tip in a block 602; forming a lead protrusion in the lead tip in a block 604; connecting a device and the external interconnect in a block 606; and encapsulating the device and the external interconnect in a block 608.

It has been discovered that the present invention thus has numerous aspects.

A principle aspect that has been unexpectedly discovered is that the present invention improves integrated circuit package system yields by mitigating or eliminating mold flashes causing inadvertent missing pins or hidden pins.

Another aspect is that the present invention provides a structure, such as the depression, in the leads to prevent or eliminate mold bleeds during the encapsulating process.

Yet another aspect of the present invention provides a mold design forming the mold bleed prevention structure. The top chase and the bottom chase having protrusions form the structure in the leads when clamped together for the encapsulating process.

Yet another aspect of the present invention provides a mold design forming the mold bleed prevention structure for single row or multiple rows of leads.

Yet another aspect of the present invention provides the mold bleed prevention structure in the leads for different integrated circuit package types. The present invention may be used with wire bonded dies, flip chips, or stacked devices.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
   forming an external interconnect having a lead body and a lead tip thinner than the lead body;
   forming a lead protrusion in the thinned lead tip, the lead protrusion having a top recess with a bottom extent opposite the top recess below the thinned lead tip and above a bottom extent of the lead body;
   connecting a device and the external interconnect; and
   encapsulating the device and the external interconnect.

2. The method as claimed in claim 1 wherein forming the lead protrusion includes forming the lead protrusion having a lead protrusion height with a maximum value below an inner body thickness of the lead body.

3. The method as claimed in claim 1 wherein encapsulating the device and the external interconnect includes not encapsulating the lead protrusion.

4. The method as claimed in claim 1 further comprising forming dual rows of external interconnects.

5. The method as claimed in claim 1 wherein forming the lead protrusion in the lead tip includes forming the lead protrusion in a mold.

6. A method of manufacture of an integrated circuit package system comprising:
   forming an inner lead and an outer lead;
   forming an inner lead body and an inner lead tip from the inner lead, the inner lead tip thinner than the inner lead body;
   forming a lead protrusion in the thinned inner lead tip, the lead protrusion having a top recess with a bottom extent opposite the top recess below the inner lead tip and above a bottom extent of the lead body;
   connecting a device with the inner lead and the outer lead; and
   encapsulating the device, the inner lead, and the outer lead.

7. The method as claimed in claim 6 wherein forming the inner lead and the outer lead includes forming the inner lead and the outer lead adjacent to each other.

8. The method as claimed in claim 6 further comprising forming an outer lead body and an outer lead tip from the outer lead.

9. The method as- claimed in claim 6 wherein connecting the device with the inner lead and outer lead includes connecting an integrated circuit die with the inner lead and outer lead.

10. The method as claimed in claim 6 wherein forming the lead protrusion in the lead tip includes:
    forming a top chase having a first protrusion of a mold;
    forming a bottom chase having a second protrusion of the mold; and
    clamping the top chase and the bottom chase for forming the lead protrusion.

11. An integrated circuit package system comprising:
    an external interconnect having a lead body and a lead tip thinner than the lead body;
    a lead protrusion in the thinned lead tip, the lead protrusion having a top recess with a bottom extent opposite the top recess below the thinned lead tip and above a bottom extent of the lead body;
    an internal interconnect between a device and the external interconnect; and
    an encapsulation of the device and the external interconnect.

12. The system as claimed in claim 11 wherein the external interconnect is a lead.

13. The system as claimed in claim 11 wherein the lead protrusion has a lead protrusion height with a maximum value below a body thickness of the lead body.

14. The system as claimed in claim 11 wherein the encapsulation of the device and the external interconnect does not cover the lead protrusion.

15. The system as claimed in claim 11 further comprising dual rows of external interconnects.

16. The system as claimed in claim 11 further comprising:
    an inner lead having an inner lead body and an inner lead tip from the inner lead,
    wherein:
    the inner lead tip has a lead protrusion,
    the inner lead is connected to the device with the internal interconnect, and
    the inner lead is covered by the encapsulation; and
    an outer lead, wherein the outer lead is connected to the device with the internal interconnect and covered by the encapsulation.

17. The system as claimed in claim 16 wherein the internal interconnect is a bond wire.

18. The system as claimed in claim 16 wherein the inner lead and the outer lead are adjacent to each other.

19. The system as claimed in claim 16 wherein the outer lead has an outer lead body and an outer lead tip.

20. The system as claimed in claim 16 wherein the device is an integrated circuit die.

* * * * *